(12) United States Patent
Katsuse

(10) Patent No.: US 12,316,084 B2
(45) Date of Patent: May 27, 2025

(54) ELECTRICAL JUNCTION BOX

(71) Applicant: SUMITOMO WIRING SYSTEMS, LTD., Mie (JP)

(72) Inventor: Shunsuke Katsuse, Mie (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 63 days.

(21) Appl. No.: 18/285,620

(22) PCT Filed: Mar. 17, 2022

(86) PCT No.: PCT/JP2022/012355
§ 371 (c)(1),
(2) Date: Oct. 4, 2023

(87) PCT Pub. No.: WO2022/215482
PCT Pub. Date: Oct. 13, 2022

(65) Prior Publication Data
US 2024/0235171 A1      Jul. 11, 2024

(30) Foreign Application Priority Data
Apr. 9, 2021   (JP) ................. 2021-066189

(51) Int. Cl.
*B60R 16/023*   (2006.01)
*H02G 3/03*     (2006.01)
*H02G 3/08*     (2006.01)

(52) U.S. Cl.
CPC ........... *H02G 3/03* (2013.01); *B60R 16/0239* (2013.01); *H02G 3/081* (2013.01)

(58) Field of Classification Search
CPC ................................................. B60R 16/0239
See application file for complete search history.

(56) References Cited

U.S. PATENT DOCUMENTS

| | | | |
|---|---|---|---|
| 2003/0168432 A1 | 9/2003 | Onizuka et al. | |
| 2005/0153583 A1 | 7/2005 | Kawamura et al. | |
| 2013/0037317 A1* | 2/2013 | Iwata | H05K 7/026 174/542 |
| 2013/0237069 A1* | 9/2013 | Katsuse | H01R 9/223 439/76.2 |

(Continued)

FOREIGN PATENT DOCUMENTS

JP     2010-114962 A     5/2010

OTHER PUBLICATIONS

International Search Report issued on May 17, 2022 for WO 2022/215482 A1 (4 pages).

*Primary Examiner* — Hung V Ngo
(74) *Attorney, Agent, or Firm* — Venjuris, P.C.

(57) ABSTRACT

The present disclosure improves heat dissipation performance. An electrical junction box (A) includes: a box main body (10) constructed by assembling a side wall member (14) to an outer surface of a base member (13); and a busbar (12) housed in a busbar housing chamber (44) of the side wall member (14), and a heat dissipation space (72) that brings the busbar housing chamber (44) into communication with the outside of the box main body (10) is formed between the base member (13) and the side wall member (14). Heat in the busbar housing chamber (44) passes through the heat dissipation space (72) and is thus dissipated to the outside of the box main body (10).

5 Claims, 8 Drawing Sheets

(56) References Cited

U.S. PATENT DOCUMENTS

| | | | |
|---|---|---|---|
| 2014/0170868 A1* | 6/2014 | Komiya | B60R 16/0238 439/76.2 |
| 2016/0372904 A1* | 12/2016 | Nakayama | H02G 3/16 |
| 2018/0309278 A1* | 10/2018 | Ikeda | B60R 16/0238 |
| 2020/0120803 A1 | 4/2020 | Tsuchida et al. | |
| 2020/0153128 A1 | 5/2020 | Kakimi et al. | |
| 2020/0381905 A1* | 12/2020 | Sasaki | B60R 16/0238 |

* cited by examiner

ELECTRICAL JUNCTION BOX

CROSS REFERENCE TO RELATED APPLICATIONS

This application is a national phase of PCT application No. PCT/JP2022/012355, filed on 17 Mar. 2022, which claims priority from Japanese patent application No. 2021-066189, filed on 9 Apr. 2021, all of which are incorporated herein by reference.

TECHNICAL FIELD

The present disclosure relates to an electrical junction box.

BACKGROUND

Patent Document 1 discloses an electrical junction box in which a busbar is attached to an electronic component block made of resin. The busbar is housed in a busbar assembly portion formed in the electronic component block. An upper surface of the busbar assembly portion has a large opening in an outer surface of the electronic component block, and the busbar is exposed through this opening. Heat generated by the busbar due to energization is dissipated to the outside of the electronic component block through the opening of the busbar assembly portion.

PRIOR ART DOCUMENT

Patent Document

Patent Document 1: JP 2020-080587A

SUMMARY OF THE INVENTION

Problems to be Solved

In the electrical junction box described above, since the busbar is exposed over a wide area on the outer surface of the electronic component block, foreign matter may interfere with the busbar. As a countermeasure, it is conceivable to reduce the exposed area of the busbar by reducing the opening of the busbar assembly portion. However, when the exposed area of the busbar is reduced, heat from the busbar is unlikely to dissipate and stays inside the electronic component block.

The electrical junction box of the present disclosure has been completed based on the circumstances as described above, and an object thereof is to improve heat dissipation performance.

Means to Solve the Problem

An electrical junction box of the present disclosure includes:
- a box main body constructed by assembling a side wall member to an outer surface of a base member; and
- a busbar housed in a busbar housing chamber of the side wall member,
- wherein a heat dissipation space that brings the busbar housing chamber into communication with the outside of the box main body is formed between the base member and the side wall member.

Effect of the Invention

According to the present disclosure, it is possible to improve the heat dissipation performance.

DETAILED DESCRIPTION TO EXECUTE THE INVENTION

Figure 1:
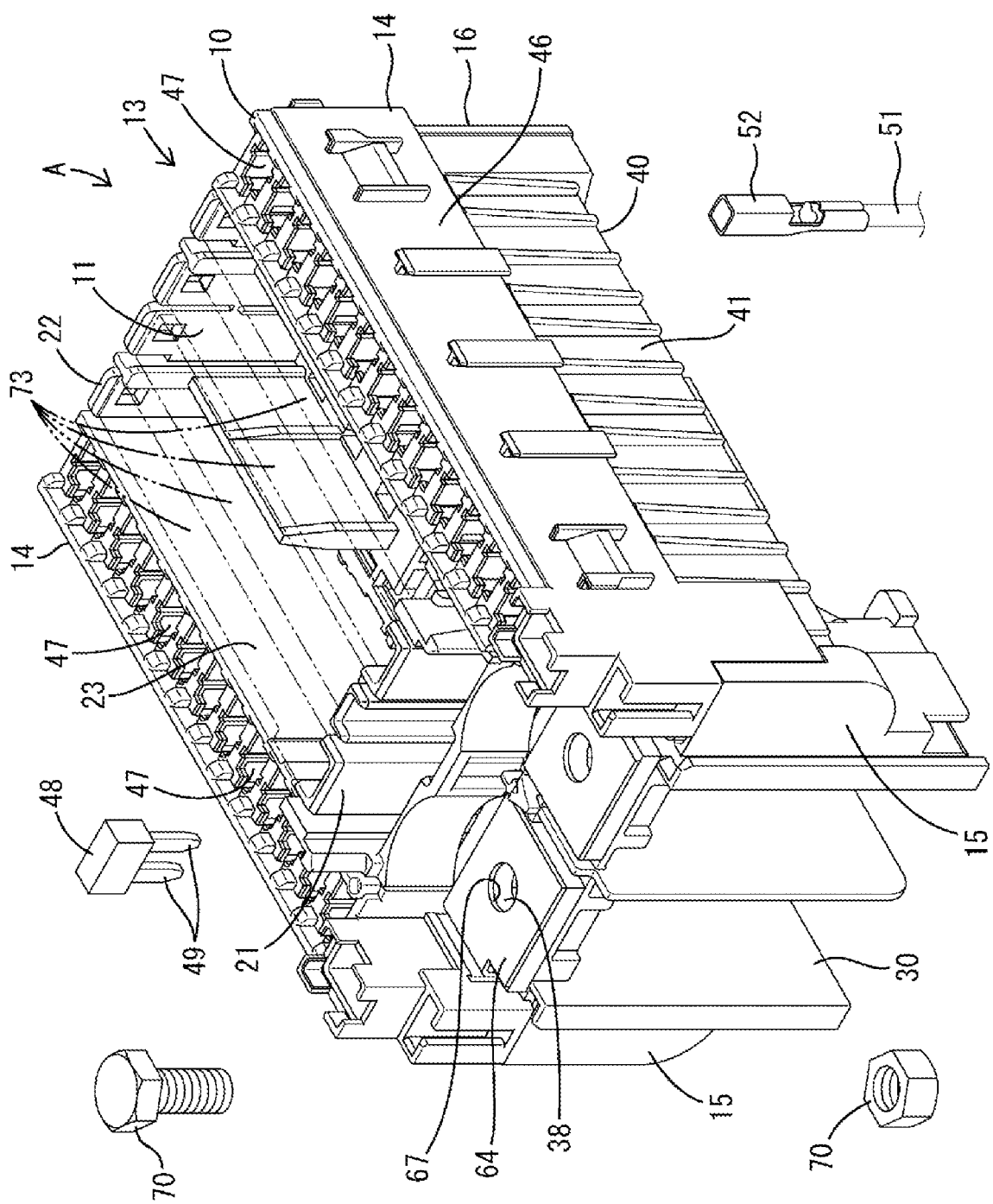
FIG. 1 is a perspective view of an electrical junction box.

Description of Embodiments of the Present Disclosure

First, embodiments of the present disclosure will be listed and described.

(1) An electrical junction box of the present disclosure includes: a box main body constructed by assembling a side wall member to an outer surface of a base member; and a busbar housed in a busbar housing chamber of the side wall member, wherein a heat dissipation space that brings the busbar housing chamber into communication with the outside of the box main body is formed between the base member and the side wall member. According to the configuration of the present disclosure, even if an opening area of the busbar housing chamber in an outer surface of the box main body is small, heat in the busbar housing chamber is dissipated to the outside of the box main body through the heat dissipation space. The electrical junction box of the present disclosure can improve heat dissipation performance while preventing foreign matter from interfering with the busbar in the busbar housing chamber.

(2) It is preferable that the side wall member has an inner wall portion dividing the busbar housing chamber and the heat dissipation space, and a cutout portion that brings the busbar housing chamber into communication with the heat dissipation space is formed in the inner wall portion. According to this configuration, heat in the busbar housing chamber is dissipated to the heat dissipation space through the cutout portion. Since the length of this heat dissipation path only corresponds to the thickness dimension of the inner wall portion, the heat dissipation efficiency is high.

(3) In (2), it is preferable that the base member is provided with a retaining protrusion for holding the base member and the side wall member in an assembled state by locking with the cutout portion. According to this configuration, the cutout portion that brings the busbar housing chamber into communication with the heat dissipation space also has a function of holding the base member and the side wall member in the assembled state, and thus the shape of the side wall member can be simplified.

(4) In (3), it is preferable that the side wall member is provided with a locking protrusion that protrudes from an opening edge portion of the cutout portion and locks to the retaining protrusion, and the heat dissipation space is secured by the locking protrusion coming into contact with the outer surface of the base member. According to this configuration, the locking protrusion for holding the base member and the side wall member in the assembled state also has a function of securing the heat dissipation space, and thus the shape of the side wall member can be simplified.

(5) It is preferable that the box main body is surrounded by a peripheral wall portion and has a component housing chamber open to an upper surface of the box main body, a portion of the side wall member above the heat dissipation space constitutes the peripheral wall portion in a state of facing the component housing chamber, and an upper end of the heat dissipation space is in communication with the component housing chamber. According to this configuration, heat in the busbar housing chamber passes through the heat dissipation space and the component housing chamber in this order and is dissipated to the outside above the box main body. Since the side wall member constitutes the peripheral wall portion in a state of facing the component housing chamber, a size of the box main body can be reduced in a thickness direction of the side wall member and the peripheral wall portion as compared with a case where the peripheral wall portion is formed integrally with the base member and the side wall member is overlapped on an outer surface of the peripheral wall portion.

DETAILS OF EMBODIMENTS OF THE PRESENT DISCLOSURE

First Embodiment

Figure 5:
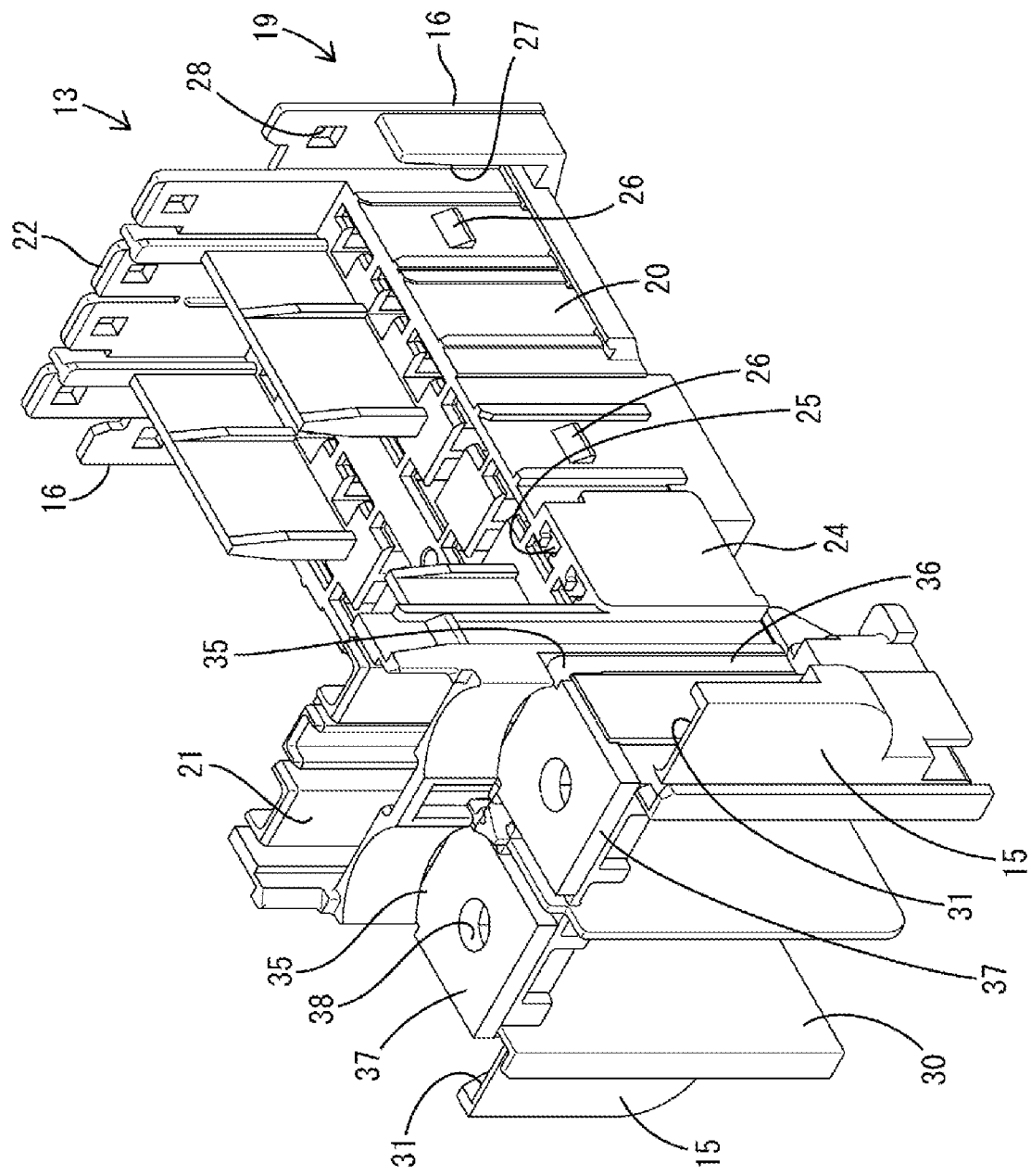
FIG. 5 is a perspective view of the base member.
Figure 6:
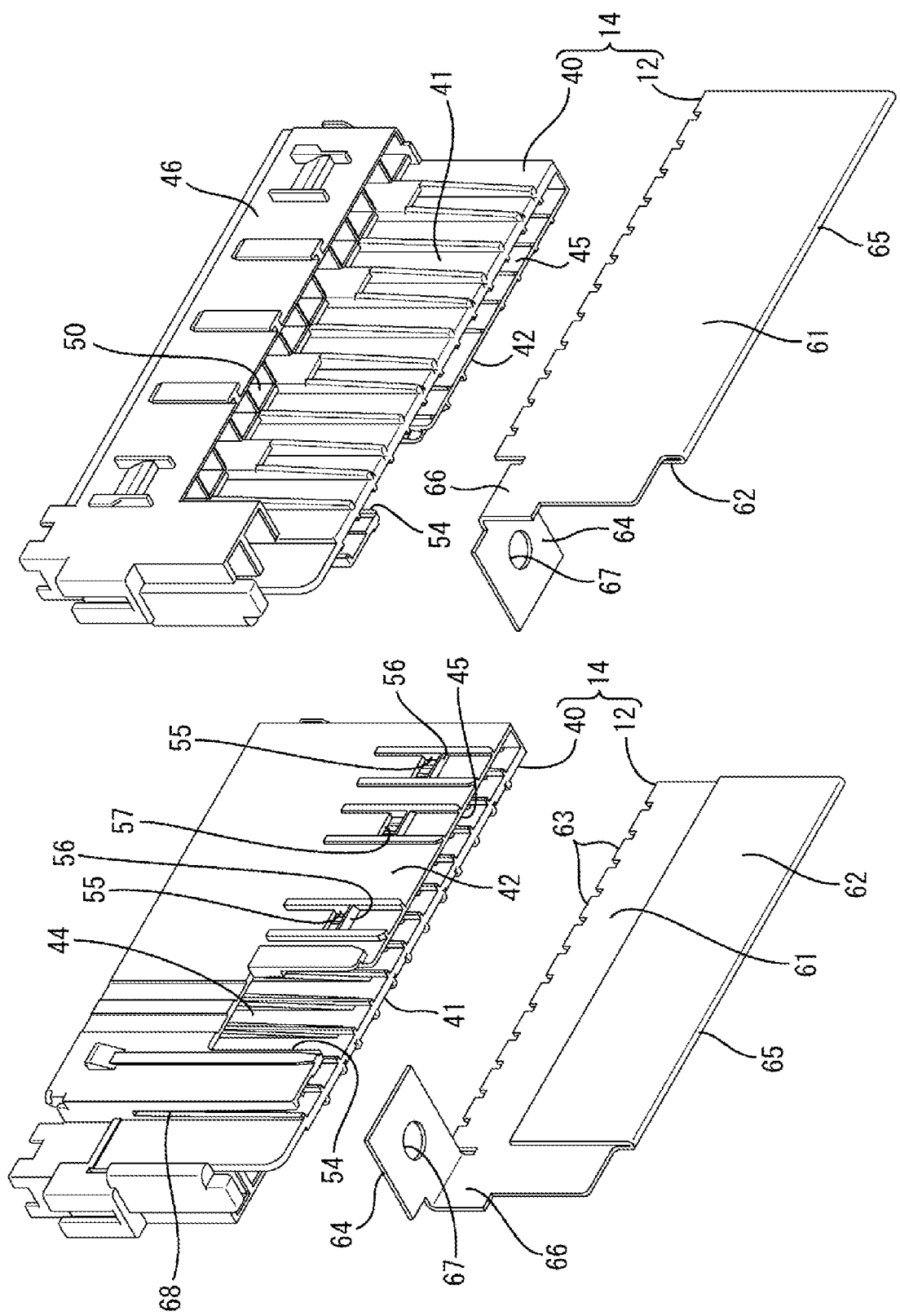
FIG. 6 is a perspective view illustrating a state in which the side wall member is separated into a side wall main body and a busbar.
Figure 7:
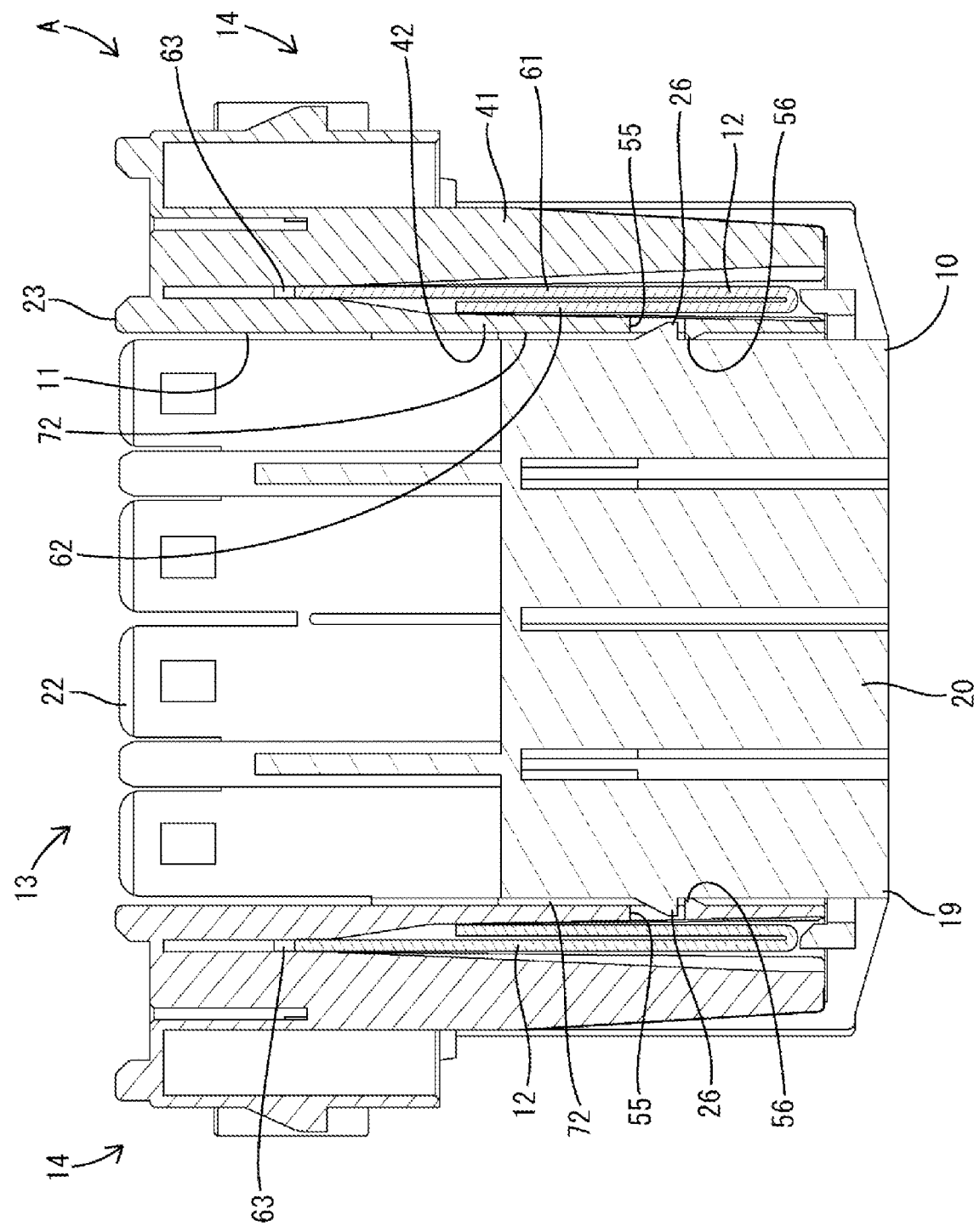
FIG. 7 is a front cross-sectional view illustrating a locking structure between a retaining hole of the side wall member and a retaining protrusion of the base member.
Figure 8:
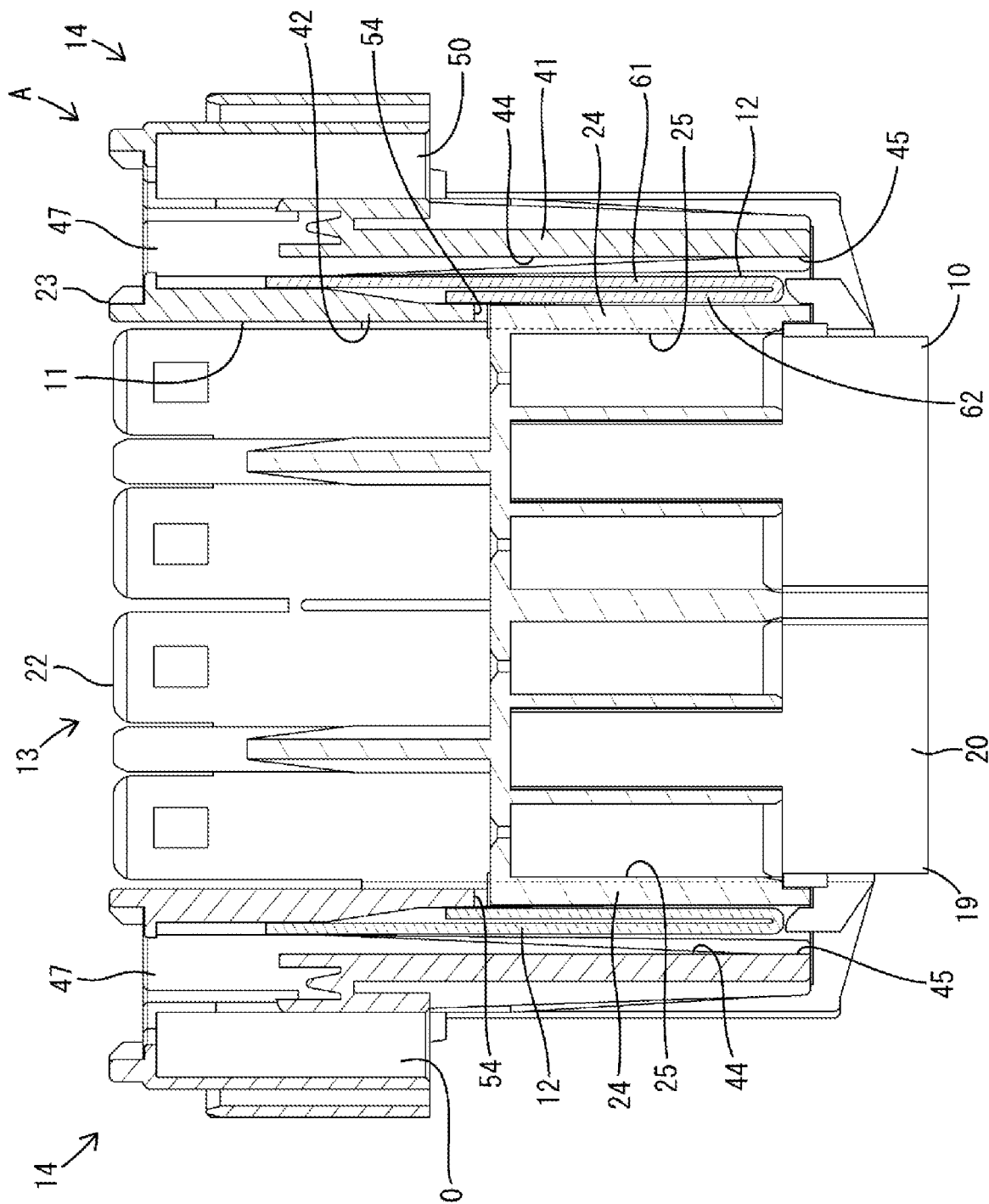
FIG. 8 is a front cross-sectional view illustrating a fitting structure between an opening of the side wall member and a protruding portion of the base member.

A first embodiment embodying an electrical junction box of the present disclosure will be described with reference to FIGS. 1 to 8. Note that the present invention is not limited to these examples, but is indicated by the scope of the claims, and includes all modifications within the meaning and scope of equivalents to the scope of the claims. In the first embodiment, regarding front and rear directions of an electrical junction box A, a direction extending obliquely downward and the left in FIGS. 1, 4, and 5, a left direction in FIGS. 2 and 3, and the direction extending obliquely upward and to the left in FIG. 6 are defined as the forward direction. Regarding up and down directions, directions illustrated in FIGS. 1 and 4 to 8 are defined as up and down as they are. Regarding left and right directions, directions illustrated in FIGS. 7 and 8 are defined as left and right as they are.

Overview of Electrical Junction Box A

The electrical junction box A of the first embodiment functionally includes a box main body 10 (see FIGS. 1 to 3) and a pair of bilaterally symmetrical busbars 12 (see FIG. 6). Inside the box main body 10, there is a component housing chamber 11 whose upper surface is open in a rectangular shape. The component housing chamber 11 is surrounded by a peripheral wall portion 23 having a rectangular shape in a plan view. A plurality of electrical components 73 such as a fusible link are to be housed in the component housing chamber 11.

Figure 4:
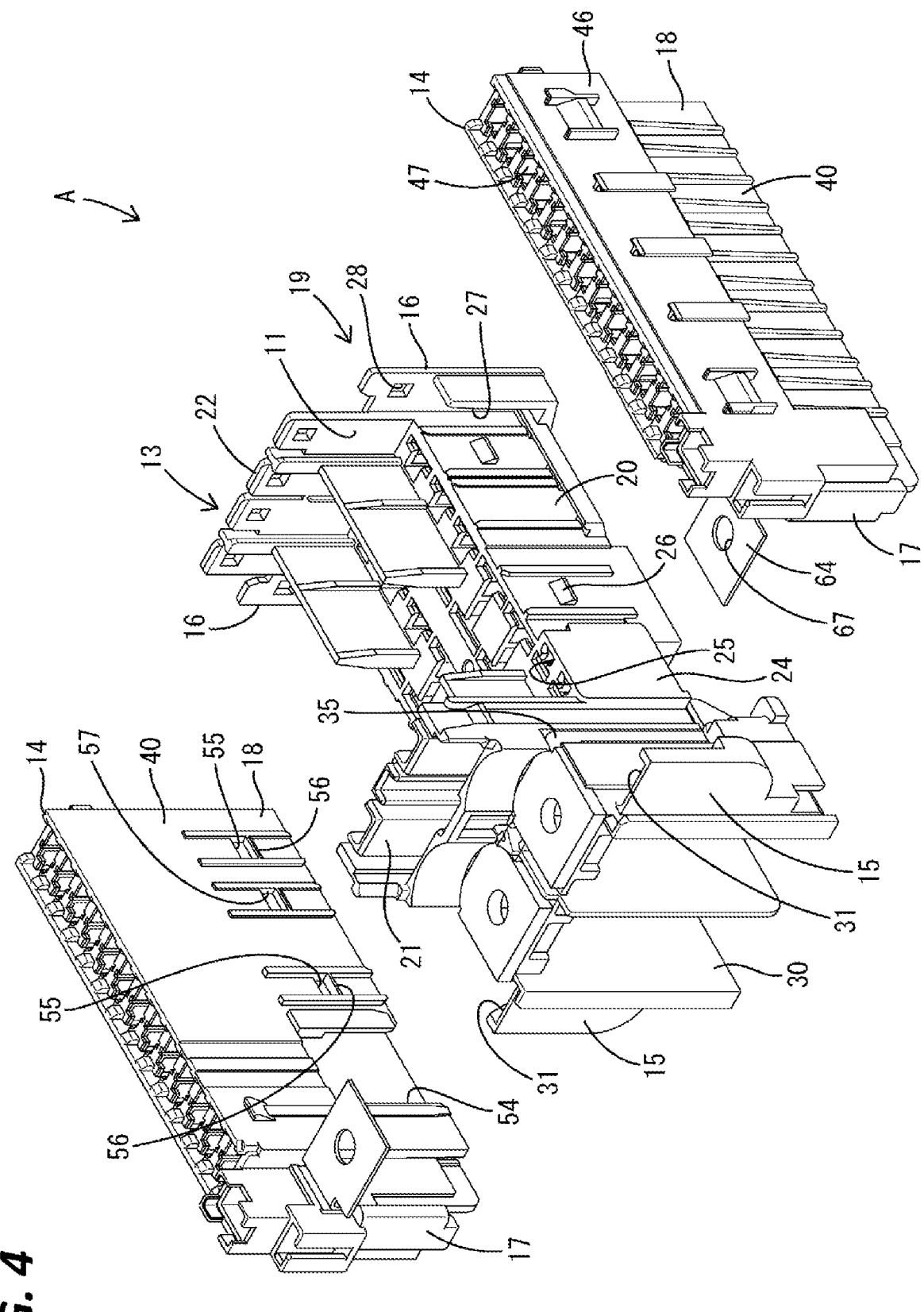
FIG. 4 is a perspective view illustrating a state in which the electrical junction box is separated into a base member and a side wall member.

As illustrated in FIGS. 1 and 4, the electrical junction box A is formed by structurally assembling a base member 13 and a pair of bilaterally symmetrical side wall members 14, which are separate members from the base member 13. The pair of side wall members 14 are assembled so as to sandwich the base member 13 from the left and right. The base member 13 and the side wall members 14 constitute the box main body 10. Each busbar 12 constitutes a side wall member 14.

A pair of left and right front fitting portions 15 are formed at front end portions of the base member 13, and a pair of left and right rear fitting portions 16 are formed at rear end portions of the base member 13. As illustrated in FIG. 4, a pair of left and right front insertion portions 17 are formed at front end portions of the side wall members 14, and a pair of left and right rear insertion portions 18 are formed at rear end portions of the side wall members 14. The base member 13 and the side wall members 14 are held in the assembled state by fitting between the front fitting portions 15 and the front insertion portions 17 and fitting between the rear fitting portions 16 and the rear insertion portions 18.

Base Member 13

The base member 13 includes a synthetic resin holding member 19, a synthetic resin terminal block 30 which is a separate component from the holding member 19, and a pair of laterally symmetrical metal plates 35. As illustrated in FIGS. 4 and 5, the holding member 19 is a single component including: a main body portion 20 having a rectangular parallelepiped shape whose long sides are directed in the front-rear direction; a front plate portion 21 extending upward from a front edge of the main body portion 20; and a rear plate portion 22 extending upward from a rear edge of main body portion 20. The space surrounded by an upper surface of the main body portion 20, a rear surface of the front plate portion 21, and a front surface of the rear plate portion 22 functions as the component housing chamber 11. The front plate portion 21 and the rear plate portion 22 constitute the peripheral wall portion 23. When the side wall members 14 are not assembled to the base member 13, the component housing chamber 11 is open to the outside of the base member 13 on an upper surface of the base member 13 and on the left and right side surfaces of the base member 13.

As illustrated in FIGS. 5 and 8, protruding portions 24 are formed at front end portions of both left and right outer surfaces of the main body portion 20. Each protruding portion 24 is a portion constituting an outer wall of a cavity 25 formed inside the main body portion 20 at the front end portion thereof. The protruding portion 24 protrudes laterally in a stepped manner with respect to other regions of the outer surface of the main body portion 20. A protrusion dimension of the protruding portion 24 is the same dimension as the thickness of an inner wall portion 42 of the side wall member 14 described later. As illustrated in FIGS. 5 and 7, a pair of retaining protrusions 26 are formed on each of the left and right outer surfaces of the main body portion 20 at intervals in the front-rear direction. The retaining protrusions 26 protrude from the outer surface of the main body portion 20 toward the corresponding side wall member 14.

A pair of laterally symmetrical rear fitting portions 16 are formed at left and right ends of the rear plate portion 22. Each rear fitting portion 16 is provided with a guide groove 27 that is elongated in the up-down direction and is open forward and upward. The rear fitting portion 16 is provided with a locking hole 28 extending through the rear fitting portion 16 in the front-rear direction and in communication with the inside of the guide groove 27.

As illustrated in FIG. 5, the terminal block 30 is assembled to the holding member 19 so as to overlap a front surface of the front plate portion 21. The pair of laterally symmetrical front fitting portions 15 are formed at left and right ends of the terminal block 30. A groove 31 extending in the up-down direction that is open upward and rearward is formed in a rear surface of each front fitting portion 15. Bolt holes 32 (see FIG. 3) are formed extending vertically through the terminal block 30.

As illustrated in FIG. 5, each plate 35 is a single component including a plate-like power supply portion 36 and a plate-like mounting portion 37 which are connected at right angles to each other. The plate-like mounting portion 37 horizontally extends forward from an upper end of the plate-like power supply portion 36 and is disposed on an upper surface of the terminal block 30. In a state where the plate 35 is mounted on the base member 13, the plate-like power supply portion 36 is housed between the front plate portion 21 and the terminal block 30, and the plate-like mounting portion 37 is placed on the upper surface of the terminal block 30. A mounting hole 38 is formed in the plate-like mounting portion 37 so as to be aligned with the corresponding bolt hole 32. A power supply terminal (not illustrated) connected to a battery (not illustrated) is to be connected to the plate-like power supply portion 36.

Side Wall Member 14

As illustrated in FIG. 6, each side wall member 14 is formed by assembling a side wall main body 40 made of a synthetic resin and the busbar 12 made of metal to each other. The side wall main body 40 is a single component that is elongated in the front-rear direction in a plan view and whose wall thickness direction is oriented in the left-right direction. An upper end portion of the side wall member 14 constitutes the peripheral wall portion 23. The side wall main body 40 has an outer wall portion 41 whose wall thickness direction is oriented in the left-right direction and an inner wall portion 42 whose wall thickness direction is oriented in the left-right direction. An upper end portion of the inner wall portion 42 faces the component housing chamber 11. A lower end portion of a front edge portion of the side wall main body 40 functions as the front insertion portion 17. A lower end portion of a rear edge portion of the side wall main body 40 functions as the rear insertion portion 18. A protruding locking portion (not illustrated) is formed on a rear end surface of the side wall main body 40.

As illustrated in FIGS. 7 and 8, inside the side wall main body 40, one busbar housing chamber 44 is formed between the outer wall portion 41 and the inner wall portion 42. The busbar housing chamber 44 is a narrow space with a left-right length smaller than a front-rear length and an up-down length. As illustrated in FIGS. 6 to 8, a lower surface of the side wall main body 40 is provided with a busbar mounting port 45 that is open in a slit shape in the front-rear direction. The busbar mounting port 45 is an opening for mounting the busbar 12 in the busbar housing chamber 44.

As illustrated in FIGS. 4, 6, and 8, an upper end portion of the side wall main body 40 is provided with a widened portion 46 that is wider than a lower end portion of the side wall main body 40. In the widened portion 46, a plurality of fuse housing chambers 47 open to an upper surface of the side wall main body 40 are arranged in a line in the front-rear direction. Lower end portions of the plurality of fuse housing chambers 47 are in communication with the busbar housing chamber 44. A fuse 48 (see FIG. 1) is mounted in a fuse housing chamber 47 from above the side wall member 14. One lead 49 of the fuse 48 is connected to a tab 63 of the busbar 12. A plurality of housing recesses 50 open to the lower surface of the side wall main body 40 are arranged in a line in the front-rear direction in a lower end region of the widened portion 46. Upper ends of the plurality of housing recesses 50 are respectively in communication with lower ends of the plurality of fuse housing chambers 47. A harness terminal 52 (see FIG. 1) connected to an electric wire 51 is housed in each housing recess 50. The harness terminal 52 is connected to the other lead 49 of the fuse 48.

As illustrated in FIGS. 4 and 6 to 8, an opening 54, a pair of retaining holes 55, a pair of locking protrusions 56, and a communication hole 57 are formed in a lower end region of the inner wall portion 42, that is, the same height region as the main body portion 20 of the base member 13. The opening 54 is formed in a front end region of the inner wall portion 42. The opening 54 is open to a lower edge of the inner wall portion 42 and brings the busbar housing chamber 44 into communication with the outside of the side wall main body 40. The pair of retaining holes 55 are disposed rearward of the opening 54 and are spaced apart from each other in the front-rear direction. Each retaining hole 55 brings the inside of the busbar housing chamber 44 into communication with the outside of the side wall main body 40. The pair of locking protrusions 56 respectively protrude from a lower edge of an opening edge of the retaining holes 55. A protruding direction of the locking protrusions 56 is opposite to the busbar housing chamber 44 in the left-right direction, and is a direction extending toward the base member 13. The communication hole 57 is disposed between the pair of retaining holes 55 and brings the inside of the busbar housing chamber 44 into communication with the outside of the side wall main body 40.

As illustrated in FIGS. 6 to 8, the busbar 12 is a single component formed by bending a flat metal plate punched into a predetermined shape. The busbar 12 includes a flat plate-like substrate portion 61 whose plate thickness direction is directed in the left-right direction, a flat plate-like heatsink portion 62, a plurality of tabs 63, and a flat plate-like connection plate portion 64. In a side view of the busbar 12 in the left-right direction, the substrate portion 61 and the heatsink portion 62 are rectangular in shape. The heatsink portion 62 is disposed so as to overlap an inner surface of the substrate portion 61. A lower edge of the substrate portion 61 and a lower edge of the heatsink portion 62 are connected to each other via a bent portion 65 having a U-shaped cross-section. The plurality of tabs 63 protrude upward from an upper edge of the substrate portion 61 and are arranged side by side at intervals in the front-rear direction. The connection plate portion 64 protrudes horizontally inward from an upper edge of a support portion 66 at a front end portion of the substrate portion 61. A through-hole 67 is formed in the connection plate portion 64 so as to extend therethrough in the up-down direction.

The busbar 12 is assembled to the side wall main body 40 from below. Specifically, the substrate portion 61, the heatsink portion 62, and the tabs 63 are housed in the busbar housing chamber 44 via the busbar mounting port 45. The substrate portion 61 is disposed so as to overlap the outer wall portion 41. The heatsink portion 62 is disposed so as to overlap the inner wall portion 42. In a state where the side wall member 14 is removed from the base member 13, the heatsink portion 62 is exposed to the outside of the side wall main body 40 via the retaining holes 55 and the opening 54. The connection plate portion 64 protrudes to the outside of the side wall main body 40 from a communication groove 68 (see FIG. 6) of the inner wall portion 42. The connection plate portion 64 protrudes inward of the side wall main body 40 in the left-right direction, that is, toward the base member 13. The bent portion 65 at a lower edge of the busbar 12 is located near the busbar mounting port 45.

Procedure for Assembling Electrical Junction Box A

When assembling the electrical junction box A, the plate-like mounting portion 37 of the plate 35 is placed on the terminal block 30 in a state where the holding member 19 and the terminal block 30 are separated, and the plate-like power supply portion 36 is overlapped on a rear surface of the terminal block 30. When the terminal block 30 and the plate 35 are assembled in this state, the plate 35 is held between the holding member 19 and the terminal block 30, and assembly of the base member 13 is completed.

After assembling the base member 13, the electrical components 73 are mounted on the holding member 19 from above the base member 13 so as to be housed in the component housing chamber 11. Since the component housing chamber 11 is open to both left and right sides of the base member 13, if an operator pinches an electrical component 73 from the left and right, fingers pinching the electrical component 73 will not interfere with the base member 13. Even when the electrical component 73 is mounted using an automatic machine, if the electrical component 73 is held so as to be sandwiched from the left and right by fingers of the automatic machine, the fingers will not interfere with the base member 13.

Next, each side wall member 14 is assembled to the base member 13. During assembly, the front insertion portion 17 is fitted into the groove 31 of the front fitting portion 15 so as to be inserted from above, and the rear insertion portion 18 is fitted into the guide groove 27 of the rear fitting portion 16 so as to be inserted from above. When the side wall member 14 enters a predetermined assembled state with respect to the base member 13, the protruding locking portion (not illustrated) formed at the rear end portion of the side wall member 14 is locked to the locking hole 28. The protruding portion 24 of the base member 13 enters the opening 54 and faces the heatsink portion 62. By fitting the front insertion portion 17 into the front fitting portion 15, the side wall member 14 is positioned in the front-rear direction and the left-right direction with respect to the base member 13.

At a rear end portion of the box main body 10, the side wall member 14 is restricted from being detached upward from the base member 13 by locking between the protruding locking portion (not illustrated) and the locking hole 28. Between the base member 13 and the side wall member 14, the retaining protrusions 26 are locked by a hole edge portion of the retaining holes 55 and the locking protrusions 56 protruding from opening edges of the retaining holes 55. The side wall member 14 is also restricted from being detached upward from the base member 13 by a locking action of the retaining holes 55 and the locking protrusions 56 on the retaining protrusions 26.

When the side wall members 14 are mounted on the base member 13, the component housing chamber 11 is covered from both the left and right sides by the side wall members 14, and assembly of the electrical junction box A is completed. The front plate portion 21, the rear plate portion 22, and the side wall members 14 form the peripheral wall portion 23, and the component housing chamber 11 is surrounded by the peripheral wall portion 23 over the entire circumference of the base member 13 in the front-rear direction and the left-right direction. The connection plate portion 64 of the busbar 12 is overlapped on an upper surface of the plate-like mounting portion 37 of the plate 35. The plate 35 and the busbar 12 are fixed to the terminal block 30 when a bolt 70 is inserted through the through-hole 67, the mounting hole 38, and the bolt hole 32, screwed into a nut 71 provided on the terminal block 30, and fastened. By fixing the connection plate portion 64 to the terminal block 30, the front end portion of the side wall member 14 is fixed to the front end portion of the base member 13.

Figure 2:
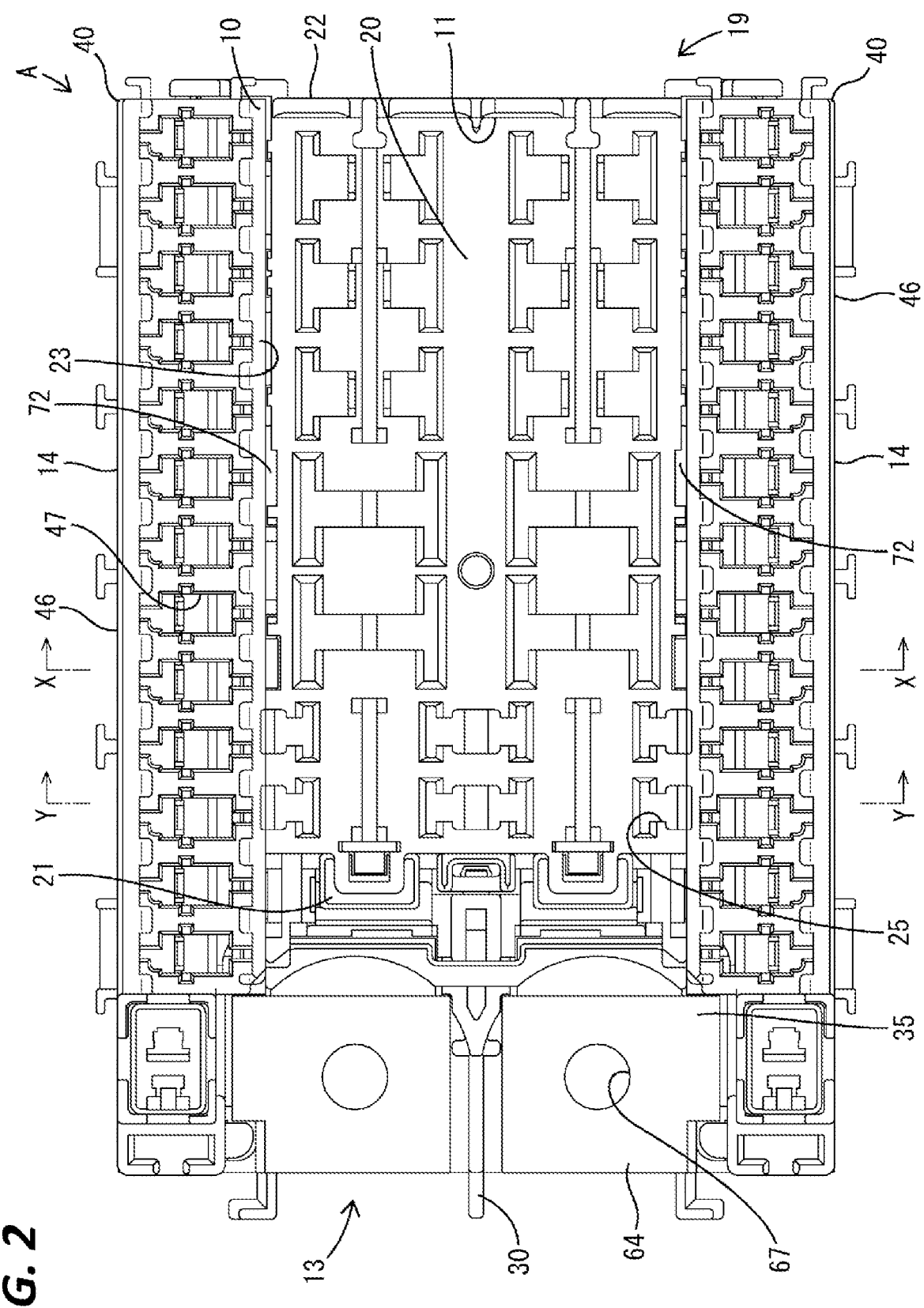
FIG. 2 is a plan view of the electrical junction box.
Figure 3:
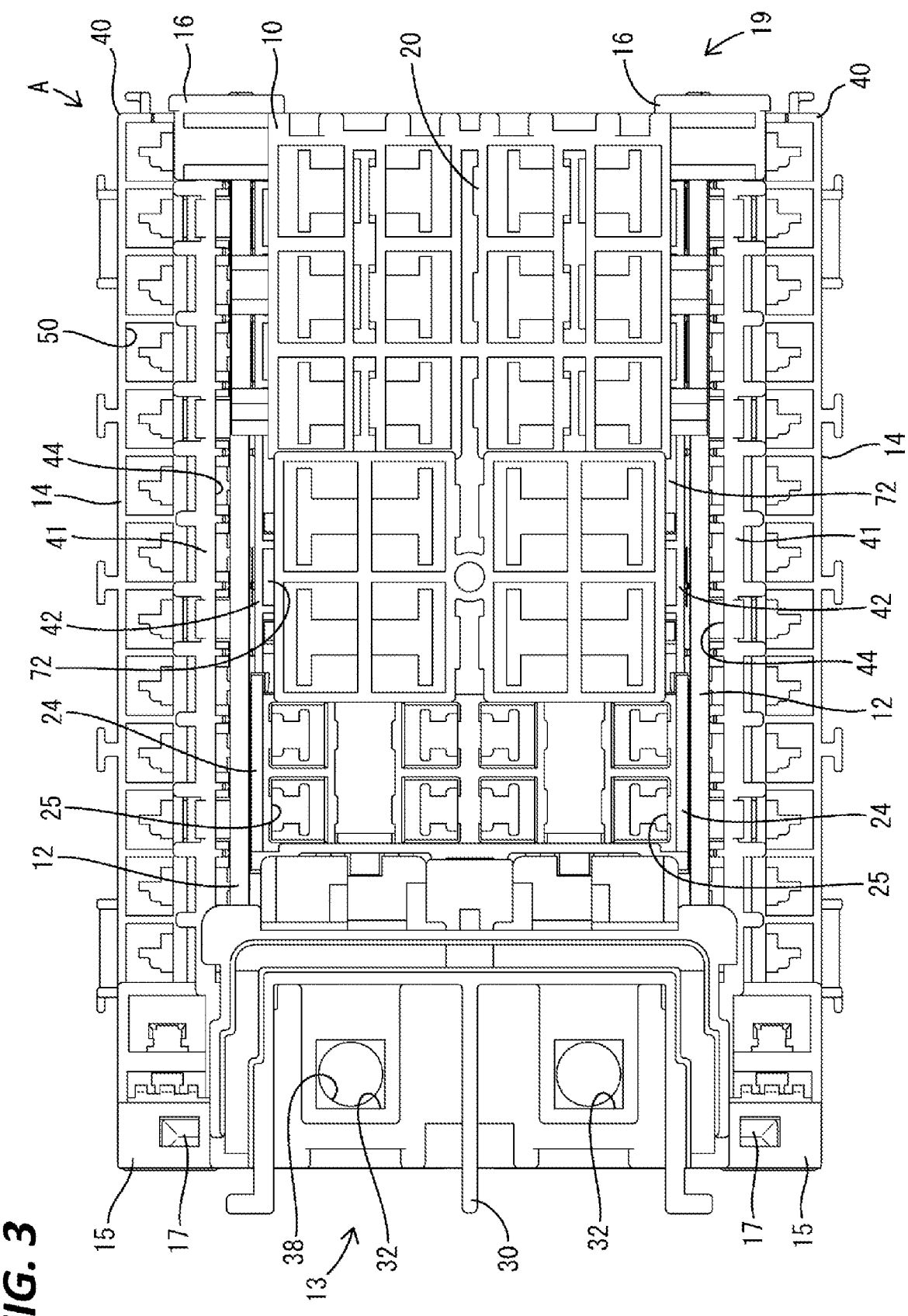
FIG. 3 is a bottom view of the electrical junction box.

As illustrated in FIGS. 2, 3, and 7, when the base member 13 and the side wall members 14 are assembled to each other, a pair of left and right heat dissipation spaces 72 are formed between the base member 13 and the side wall members 14. Each heat dissipation space 72 is a space having a left-right length that is smaller than an up-down length and a front-rear length thereof. Since the locking protrusions 56 protruding from the inner wall portion 42 are in contact with the outer surface of the main body portion 20, even if the side wall member 14 is pressed toward the base member 13, the heat dissipation space 72 is not reduced in the left-right direction, and an air flow path is secured in the heat dissipation space 72. A lower end of the heat dissipation space 72 is open at a lower end surface of the box main body 10, and an upper end of the heat dissipation space 72 is in communication with the component housing chamber 11. The busbar housing chamber 44 and the heat dissipation space 72 are in communication with each other via a space between an upper end of the opening 54 and an upper end of the protruding portion 24, a space between the retaining holes 55 and the retaining protrusions 26, and the communication hole 57.

When the busbar 12 is energized, heat is generated in the busbar 12 and the temperature of the busbar housing chamber 44 rises. Due to a temperature difference between the outside and the inside of the box main body 10, relatively low temperature outside air flows into the heat dissipation space 72 from an opening of the lower end surface of the box main body 10, and an upward air flow is generated. The air flow in the heat dissipation space 72 takes heat in the busbar housing chamber 44 as it flows into the component housing chamber 11, and the air flow is dissipated into the atmosphere through an opening in an upper surface of the box main body 10.

The electrical junction box A of the present embodiment includes a box main body 10 constructed by assembling the side wall member 14 to an outer surface of the base member 13, and the busbar 12 housed in the busbar housing chamber 44 of the side wall member 14. The heat dissipation space 72 bringing the busbar housing chamber 44 into communication with the outside of the box main body 10 is formed between the base member 13 and the side wall member 14. An opening of the busbar housing chamber 44 in the outer surface of the box main body 10 is the busbar mounting port 45 in a lower surface of the box main body 10. Since an opening area of the busbar mounting port 45 is small, there is no concern that foreign matter will interfere with the busbar 12 in the busbar accommodation chamber 44. Although the opening area of the busbar mounting port 45 is small, heat in the busbar housing chamber 44 is dissipated to the outside of the box main body 10 through the heat dissipation space 72 and the component housing chamber 11. Therefore, the electrical junction box A of the present embodiment can improve heat dissipation performance while preventing foreign matter from interfering with the busbar 12.

The side wall member 14 has the inner wall portion 42 dividing the busbar housing chamber 44 and the heat dissipation space 72. The inner wall portion 42 is provided with the opening 54, the retaining holes 55, and the communication hole 57 serving as a cutout portion that brings the busbar housing chamber 44 into communication with the heat dissipation space 72. Heat in the busbar housing chamber 44 is dissipated to the heat dissipation space 72 through the opening 54, the retaining holes 55, and the communication hole 57. Since the length of the heat dissipation path extending through the opening 54, the retaining holes 55, and the communication hole 57 only corresponds to the thickness dimension of the inner wall portion 42, the heat dissipation efficiency is high.

The base member 13 is provided with the retaining protrusions 26 for holding the base member 13 and the side wall member 14 in the assembled state by locking with the retaining holes 55. That is, the retaining holes 55 bringing the busbar housing chamber 44 and the heat dissipation space 72 into communication also have the function of holding the base member 13 and the side wall member 14 in the assembled state. The shape of the side wall member 14 can be simplified as compared with a case where a portion for holding the base member 13 and the side wall member 14 in the assembled state is formed separately from the retaining holes 55.

The side wall member 14 is provided with the locking protrusions 56 protruding from opening edge portions of the retaining hole 55 and locked to the retaining protrusions 26. The heat dissipation space 72 is secured by the locking protrusions 56 coming into contact with the outer surface of the base member 13. The locking protrusions 56 for holding the base member 13 and the side wall member 14 in the assembled state also have the function of securing the heat dissipation space 72. Therefore, the shape of the side wall member 14 can be simplified as compared with a case where a dedicated portion for ensuring the heat dissipation space 72 is provided on the inner wall portion 42 separately from the locking protrusions 56.

The box main body 10 is surrounded by the peripheral wall portion 23 and has the component housing chamber 11 open to the upper surface of the box main body 10. A portion of the side wall member 14 above the heat dissipation space 72 constitutes the peripheral wall portion 23 in a state of facing the component housing chamber 11. The upper end of the heat dissipation space 72 is in communication with the component housing chamber 11. According to this configuration, heat in the busbar housing chamber 44 passes through the heat dissipation space 72 and the component housing chamber 11 in this order and is dissipated to the outside above the box main body 10. Since the side wall member 14 constitutes the peripheral wall portion 23 in a state of facing the component housing chamber 11, the size of the box main body 10 can be reduced in the thickness direction of the side wall member 14 and the peripheral wall portion 23, that is, in the left-right direction as compared with a case where the base member 13 constitutes the entire circumference of the peripheral wall portion 23, and the side wall member 14 overlaps the outer surface of the peripheral wall portion 23 (that is, a case where the peripheral wall portion is formed integrally with the base member and the side wall member is overlapped on the outer surface of the peripheral wall portion).

Other Embodiments

The present invention is not limited to the embodiment described by the above description and drawings, but is indicated by the claims. The present invention includes all modifications within the meaning and scope of equivalents to the claims, and also includes the following embodiments.

In the above embodiment, the busbar housing chamber and the heat dissipation space are in communication with each other via the cutout portion of the inner wall portion, but the busbar housing chamber and the heat dissipation space may be in communication with each other via a path other than the cutout portion.

In the above embodiment, the locking protrusion also has the function of securing the heat dissipation space, but a dedicated portion for securing the heat dissipation space may be formed separately from the locking protrusion.

In the above embodiment, the side wall member faces the component housing chamber, but the side wall member may be disposed to overlap the outer surface of the peripheral wall portion of the base member without facing the component housing chamber.

LIST OF REFERENCE NUMERALS

A Electrical junction box
10 Box main body
11 Component housing chamber
12 Busbar
13 Base member
14 Side wall member
15 Front fitting portion
16 Rear fitting portion
17 Front insertion portion
18 Rear insertion portion
19 Holding member
20 Main body portion
21 Front plate portion
22 Rear plate portion
23 Peripheral wall portion
24 Protruding portion
25 Cavity
26 Retaining protrusion
27 Guide groove
28 Locking hole
30 Terminal block
31 Groove
32 Bolt hole
35 Plate
36 Plate-like power supply portion
37 Plate-like mounting portion
38 Mounting hole
40 Side wall main body
41 Outer wall portion
42 Inner wall portion
44 Busbar housing chamber
45 Busbar mounting port
46 Widened portion
47 Fuse housing chamber
48 Fuse
49 Lead
50 Housing recess
51 Electric wire
52 Harness terminal
54 Opening (Cutout portion)
55 Retaining hole (Cutout portion)
56 Locking protrusion
57 Communication hole (Cutout portion)
61 Substrate portion
62 Heatsink portion
63 Tab
64 Connection plate portion
65 Bent portion
66 Support portion
67 Through-hole
68 Communication groove
70 Bolt 71 Nut
72 Heat dissipation space
73 Electrical component

What is claimed is:

1. An electrical junction box comprising:
a box main body constructed by assembling a side wall member to an outer surface of a base member; and
a busbar housed in a busbar housing chamber of the side wall member, wherein a heat dissipation space that brings the busbar housing chamber into communication with the outside of the box main body is formed between the base member and the side wall member.

2. The electrical junction box according to claim 1,
wherein the side wall member has an inner wall portion dividing the busbar housing chamber and the heat dissipation space, and
a cutout portion that brings the busbar housing chamber into communication with the heat dissipation space is formed in the inner wall portion.

3. The electrical junction box according to claim 2,
wherein the base member is provided with a retaining protrusion for holding the base member and the side wall member in an assembled state by locking with the cutout portion.

4. The electrical junction box according to claim 3,
wherein the side wall member is provided with a locking protrusion that protrudes from an opening edge portion of the cutout portion and locks to the retaining protrusion, and
the heat dissipation space is secured by the locking protrusion coming into contact with the outer surface of the base member.

5. The electrical junction box according to claim 1,
wherein the box main body is surrounded by a peripheral wall portion and has a component housing chamber open to an upper surface of the box main body,
a portion of the side wall member above the heat dissipation space constitutes the peripheral wall portion in a state of facing the component housing chamber, and
an upper end of the heat dissipation space is in communication with the component housing chamber.

* * * * *